(12) United States Patent
Ito et al.

(10) Patent No.: US 8,525,307 B2
(45) Date of Patent: Sep. 3, 2013

(54) SEMICONDUCTOR DEVICE, LEAD FRAME ASSEMBLY, AND METHOD FOR FABRICATING THE SAME

(75) Inventors: Kenichi Ito, Osaka (JP); Shigehisa Oonakahara, Kyoto (JP); Yoshikazu Tamura, Shiga (JP); Kiyoshi Fujihara, Shiga (JP)

(73) Assignee: Panasonic Corporation, Osaka (JP)

( * ) Notice: Subject to any disclaimer, the term of this patent is extended or adjusted under 35 U.S.C. 154(b) by 42 days.

(21) Appl. No.: 13/192,167

(22) Filed: Jul. 27, 2011

(65) Prior Publication Data

US 2012/0025361 A1 Feb. 2, 2012

(30) Foreign Application Priority Data

Jul. 27, 2010 (JP) .................................. 2010-168457

(51) Int. Cl.
*H01L 23/495* (2006.01)

(52) U.S. Cl.
USPC ........... 257/666; 257/667; 257/668; 257/669; 257/670; 257/671; 257/672; 257/673; 257/674; 257/675; 257/676; 257/677

(58) Field of Classification Search
USPC .......................... 257/678, 690, 692–694, 696
See application file for complete search history.

(56) References Cited

U.S. PATENT DOCUMENTS

| 6,215,174 | B1 | | 4/2001 | Takada et al. | |
|---|---|---|---|---|---|
| 6,501,156 | B1 | * | 12/2002 | Nakanishi et al. | 257/666 |
| 6,521,987 | B1 | * | 2/2003 | Glenn et al. | 257/684 |
| 6,525,406 | B1 | * | 2/2003 | Chung et al. | 257/666 |
| 7,821,119 | B2 | * | 10/2010 | Shimanuki | 257/692 |
| 2003/0127711 | A1 | * | 7/2003 | Kawai et al. | 257/666 |
| 2003/0168720 | A1 | | 9/2003 | Kamada | |
| 2007/0262328 | A1 | * | 11/2007 | Bando | 257/79 |
| 2010/0109042 | A1 | | 5/2010 | Asakawa | |
| 2011/0140143 | A1 | * | 6/2011 | Kim et al. | 257/98 |

FOREIGN PATENT DOCUMENTS

JP 03-105959 5/1991

* cited by examiner

*Primary Examiner* — Steven Loke
*Assistant Examiner* — Junaiden Mirsalahuddin
(74) *Attorney, Agent, or Firm* — McDermott Will & Emery LLP

(57) ABSTRACT

A semiconductor device includes a lead frame, a semiconductor element mounted on the lead frame, and a frame-like member formed on the lead frame, surrounding the semiconductor element, and covering a side surface of the lead frame and exposing a lower surface of the lead frame. The frame-like member has at least one concave portion in a side surface thereof. The concave portion has a ceiling portion located at the same height as or lower than an upper surface of the lead frame, and a bottom portion located higher than the lower surface of the lead frame.

13 Claims, 9 Drawing Sheets

SEMICONDUCTOR DEVICE, LEAD FRAME ASSEMBLY, AND METHOD FOR FABRICATING THE SAME

CROSS-REFERENCE TO RELATED APPLICATION

This application claims priority to Japanese Patent Application No. 2010-168457 filed on Jul. 27, 2010, the disclosure of which including the specification, the drawings, and the claims is hereby incorporated by reference in its entirety.

BACKGROUND

The present disclosure relates to semiconductor devices, lead frame assemblies, methods for fabricating semiconductor devices, and methods for fabricating lead frame assemblies. More particularly, the present disclosure relates to assemblies of surface mount lead frames, resin encapsulated semiconductor devices employing the lead frame assemblies, methods for fabricating the lead frame assemblies, and methods for fabricating the semiconductor devices.

In recent years, demands for smaller-size and higher-performance electronic apparatuses have lead to increased miniaturization of semiconductor devices. There are commercialized small-size resin encapsulated semiconductor devices employing lead frames, such as a land grid array (LGA) package, a quad flat non-leaded (QFN) package, a small outline non-leaded (SON) package, etc., in which elements are encapsulated on substantially only one side. These semiconductor devices are typically formed as follows. A sheet of metal base is initially processed by stamping, etching, etc. to form a multiple lead frame arrangement in which a plurality of lead frames are attached to rails. On the multiple lead frame arrangement, semiconductor elements are mounted, a resin is molded, etc. to form packages. The packaged lead frames are removed from the rails to obtain individual completed semiconductor devices.

In the multiple lead frame arrangement, typically, the lead frames are attached to the rails by tie bars, and the lead frames are removed from the rails by cutting the tie bars. However, when the tie bar is cut, large shear stress needs to be applied to the tie bar, and therefore, the package is likely to be damaged in the vicinity of the tie bar. It is contemplated that the tie bar may be narrowed to facilitate cutting. In this case, however, the tie bar may have insufficient holding strength. Therefore, an attempt has been made to provide an auxiliary tie bar around the tie bar (see, for example, Japanese Patent Publication No. H03-105959). The auxiliary tie bar is not attached to the lead frame, and a tip portion of the auxiliary tie bar is buried in the package resin. Because the lead frame is held by the tie bar and the auxiliary tie bar, the holding strength is increased. Moreover, the lead frame can be removed by pulling the auxiliary tie bar out of the package resin, and therefore, the package is less likely to be damaged compared to when a thicker tie bar is used.

SUMMARY

However, the above conventional technique has the following problems. In recent years, there has been a demand for a reduction in the manufacturing cost of semiconductor devices in order to lower the prices of electronic apparatuses. If a test is performed on characteristics before removing individual semiconductor devices from rails, the manufacturing cost can be expected to decrease significantly. However, it is difficult to perform the characteristic test while the lead frames are attached to the rails by tie bars. Therefore, in order to perform the characteristic test in the multiple lead frame arrangement, it is necessary to sufficiently hold the lead frames which have been cut off from the tie bar. However, it is difficult for the conventional auxiliary tie bar to sufficiently hold the lead frame by itself. In particular, the conventional auxiliary tie bar is supposed to be applied to a semiconductor device in which the opposite surfaces of the lead frame are encapsulated. If only one surface of the lead frame is encapsulated, the lower surface of the auxiliary tie bar is not covered with the encapsulation resin. Therefore, the auxiliary tie bar does not work on an upward force, so that the semiconductor device easily falls off.

The present disclosure describes implementations of a semiconductor device which is reliably held during assembly and is easily removed after assembly even when only one surface of a lead frame is encapsulated.

An example semiconductor device of the present disclosure is held by a rail via a holding lead whose tip portion is thinner than a lead frame while being held.

Specifically, the example semiconductor device includes a lead frame, a semiconductor element mounted on the lead frame, and a frame-like member formed on the lead frame, surrounding the semiconductor element, and covering a side surface of the lead frame and exposing a lower surface of the lead frame. The frame-like member has at least one concave portion in a side surface thereof. The concave portion has a ceiling portion located at the same height as or lower than an upper surface of the lead frame, and a bottom portion located higher than the lower surface of the lead frame.

According to the example semiconductor device, when the semiconductor device is held by a rail, an upper, a side, and a lower surface of a tip portion of the holding lead contact the frame-like member. Therefore, even when an upward force is applied to the holding lead, the semiconductor device is less likely to fall off. Also, by deforming the rail in the horizontal direction, the semiconductor element can be easily removed from the rail. Moreover, an electrical characteristic of the semiconductor device can be tested while the semiconductor device is held by the rail.

An example lead frame assembly of the present disclosure includes a plurality of pre-molding lead frames, and a rail configured to hold the plurality of pre-molding lead frames. Each of the plurality of pre-molding lead frames includes a lead frame, and a frame-like member formed on the lead frame, covering a side surface of the lead frame and exposing a lower surface of the lead frame. The rail includes a groove surrounding a perimeter of the lead frame, and a holding lead provided in the groove, protruding toward the lead frame and separated from the lead frame. A tip portion of the holding lead is thinner than the lead frame and is buried in a side surface of the frame-like member.

In the example lead frame assembly, the tip portion of the holding lead is thinner than the lead frame and is buried in the side surface of the frame-like member. Therefore, an upper, a side, and a lower surface of a tip portion of the holding lead contact the frame-like member. Therefore, even when an upward force is applied to the holding lead, the semiconductor device is less likely to fall off. Also, by deforming the rail in the horizontal direction, the semiconductor element can be easily removed from the rail.

An example method for fabricating a semiconductor device of the present disclosure includes the steps of (a) forming an opening in a substrate at a predetermined position to form a rail, a lead frame, a tie bar attaching the lead frame to the rail, and a holding lead protruding from the rail toward the lead frame and separated from the lead frame, (b) after step (a), forming a frame-like member which is provided on an outer edge portion of the lead frame and in which a tip portion of the holding lead is buried, to form a pre-molding lead frame including the lead frame and the frame-like member, (c) after step (b), cutting the tie bar, and (d) after step (c), pulling the tip portion of the holding lead out of the frame-like member to remove the pre-molding lead frame from the rail. In step (a), the tip portion of the holding lead is caused to be thinner than the lead frame. In step (b), the frame-like member is formed to expose a bottom surface of the lead frame and cover an upper, a side, and a lower surface of the tip portion of the holding lead.

According to the example semiconductor device fabrication method, even in the case of a one-side encapsulation type, after the tie bar is cut, sufficient strength of holding the pre-molding lead frame can be ensured. Also, by deforming the rail in the horizontal direction, the semiconductor device can be easily removed. Moreover, because the lead frame is insulated from the rail, an electrical characteristic of the semiconductor device can be tested while the semiconductor device is held by the rail.

DETAILED DESCRIPTION

Figure 1A:
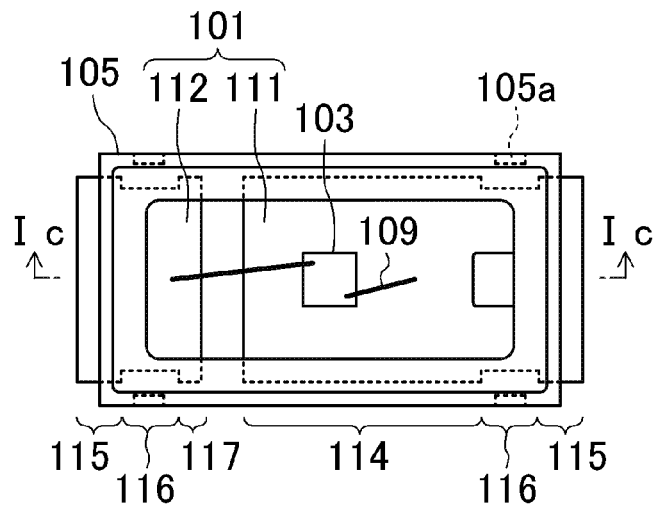
FIG. 1A is a plan view of a semiconductor device according to an embodiment.
Figure 1B:
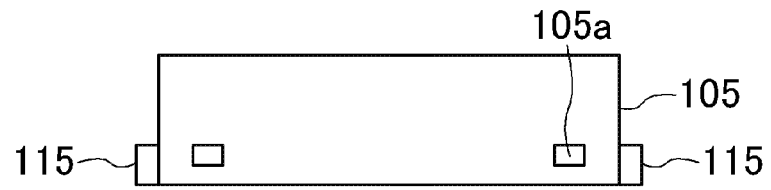
FIG. 1B is a side view of the semiconductor device of the embodiment.
Figure 1C:
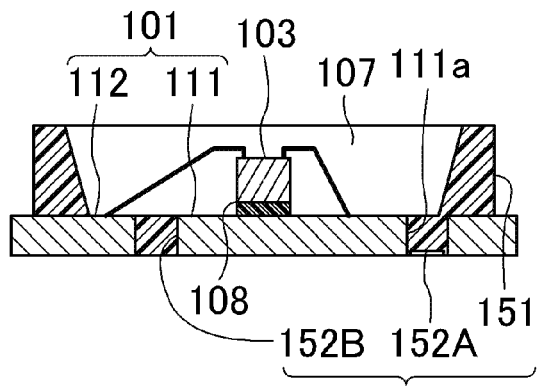
FIG. 1C is a cross-sectional view of the semiconductor device of the embodiment, taken along line Ic-Ic of FIG. 1A.
Figure 1D:
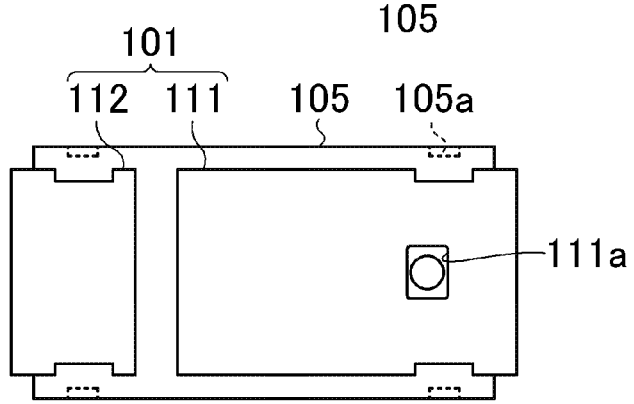
FIG. 1D is a bottom view of the semiconductor device of the embodiment.

As shown in FIGS. 1A-1D, a semiconductor device according to this embodiment includes a lead frame 101, a semiconductor element 103 mounted on the lead frame 101, a frame-like member 105 formed on the lead frame 101, surrounding the semiconductor element 103, and a protective resin 107 filling a space surrounded by the frame-like member 105. In this embodiment, the semiconductor element 103 is, but is not limited to, a light emitting diode (LED).

The lead frame 101 is made of, for example, a copper (Cu)-based alloy. An upper surface, a lower surface, etc. of the lead frame 101 are typically covered with a plating layer (not shown). The lead frame 101 typically has a thickness of about 0.15-0.3 mm. The plating layer is typically a silver plating layer, and may have a thickness of about 3-6 µm. The plating layer may be made of other materials. A silver plating layer may be formed on a nickel plating layer having a thickness of about 0.5-3 µm. In this case, diffusion of copper caused by heat during fabrication can be reduced or prevented. A gold-silver plating layer having a thickness of about 0.01-0.3 µm may be formed on the nickel and silver plating layers. In this case, a reduction in the reflectance of the plating layer can be reduced or prevented.

The lead frame 101 has a die pad portion 111 on which the semiconductor element 103 is mounted and a lead portion 112 which is separated from the die pad portion 111. The die pad portion 111 is located inside the frame-like member 105, and has an element mounting portion 114 on which the semiconductor element 103 is mounted and an external terminal 115 which protrudes outside the frame-like member 105. A constricted portion 116 which is narrower than the element mounting portion 114 and the external terminal 115 is formed between the element mounting portion 114 and the external terminal 115. A through hole 111a is formed in the constricted portion 116. The lead portion 112 is located inside the frame-like member 105, and has a wire bonding portion 117 to which a wire 109 is bonded and an external terminal 115 which protrudes outside the frame-like member 105. A constricted portion 116 which is narrower than the wire bonding portion 117 and the external terminal 115 is formed between the wire bonding portion 117 and the external terminal 115.

The frame-like member 105 is made of a resin etc., and has a wall portion 151 which surrounds an outer edge portion of the lead frame 101, a buried portion 152A which is buried in the through hole 111a of the die pad portion 111, and a buried portion 152B which is buried in a gap between the die pad portion 111 and the lead portion 112. The wall portion 151, the buried portion 152A, and the buried portion 152B are integrally formed. The frame-like member 105 is formed to cover side surfaces of the lead frame 101 and expose a bottom surface of the lead frame 101.

The semiconductor element 103 is bonded to the element mounting portion 114 of the die pad portion 111 by an adhesive 108. A plurality of top electrodes (not shown) are formed on a top surface of the semiconductor element 103, one top electrode is connected to the element mounting portion 114 via a wire 109, and another top electrode is connected to the wire bonding portion 117 of the lead portion 112 via another wire 109. Note that when the semiconductor element 103 has a back electrode, the back electrode and the element mounting portion 114 may be bonded together by a conductive paste, such as solder etc. In FIGS. 1A-1D, the semiconductor element 103 is disposed at a center of a region surrounded by the frame-like member 105. In FIG. 1, the entire semiconductor device including the external terminals 115 protruding outside the frame-like member 105 are axially symmetric, and therefore, the semiconductor element 103 is disposed at a center of the semiconductor device.

The space surrounded by the frame-like member 105 is filled with the protective resin 107 which is a transparent resin. As a result, the semiconductor element 103 and the wires 109 are encapsulated. When the semiconductor element 103 is a light emitting diode, the protective resin 107 may contain a fluorescent material which absorbs light emitted by the semiconductor element 103 to emit light having a different wavelength.

Concave portions 105a are formed on outer side surfaces of the frame-like member 105. A ceiling portion of the concave portion 105a is located at the same height as that of the upper surface of the lead frame 101, and a bottom portion of the concave portion 105a is located higher than the lower surface of the lead frame 101. The concave portion 105a is produced by pulling out a holding lead described below.

Figure 2A:
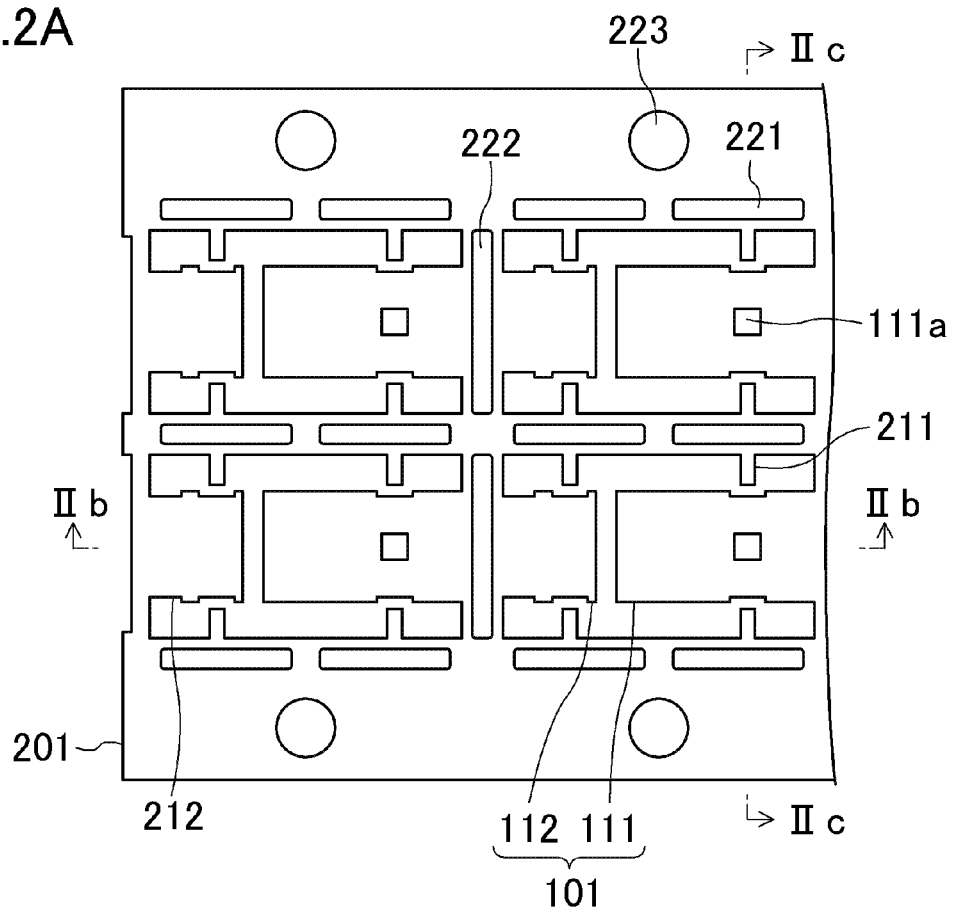
FIG. 2A is a plan view for describing a method for fabricating the semiconductor device of the embodiment.
Figure 2B:
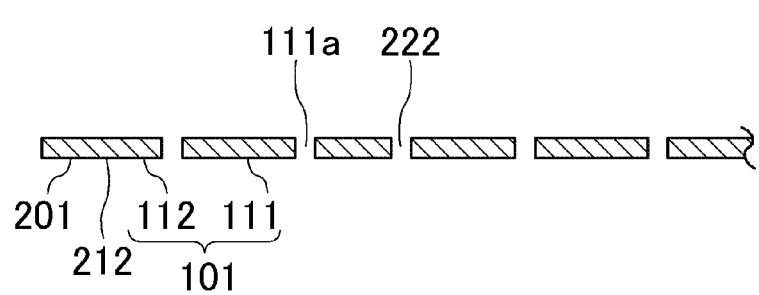
FIG. 2B is a cross-sectional view for describing the method for fabricating the semiconductor device of the embodiment, taken along line IIb-IIb of FIG. 2A.
Figure 2C:
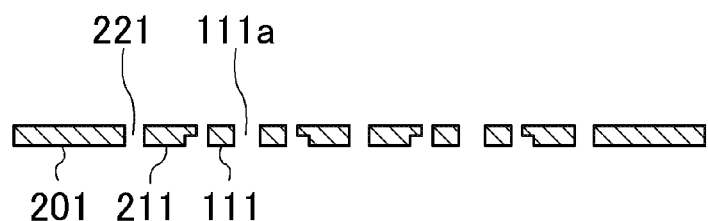
FIG. 2C is a cross-sectional view for describing the method for fabricating the semiconductor device of the embodiment, taken along line IIc-IIc of FIG. 2A.

A method for fabricating the semiconductor device of this embodiment will be described hereinafter. Initially, as shown in FIGS. 2A-2C, a base made of a copper-based alloy etc. is processed by stamping, etching, etc. to form a plurality of lead frames 101. Although FIGS. 2A-2C show an example in which a matrix of the lead frames 101 has two rows, the number of rows may be set to any value. The number of columns may also be set to any value.

In a step shown in FIGS. 2A-2C, the external terminals of the die pad portion 111 and the lead portion 112 are attached to a rail 201 by tie bars 212. Holding leads 211 which protrude toward the die pad portion 111 and the lead portion 112 are formed on the rail 201. In FIGS. 2A-2C, portions of the lead frame 101 facing the holding leads 211 are narrower than the other portions of the lead frame 101. As a result, a sufficient margin for forming a groove for removing the lead frame 101 from the rail 201 can be ensured at a portion where the holding leads 211 are formed. There are spaces between the holding leads 211, and the die pad portion 111 and the lead portion 112. A tip portion of the holding lead 211 has a smaller thickness than that of the die pad portion 111 and the lead portion 112. The rail 201 optionally has first slits 221, second slits 222, and guide holes 223. The first slits 221 are formed on a side of the holding leads 211 opposite to the die pad portion 111 and the lead portion 112. The second slits 222 are each formed between the lead frames 101 adjacent to each other in the row direction. The guide holes 223 function as a reference for positioning the rail 201, and the locations of the guide holes 223 are not particularly limited.

Figure 3A:
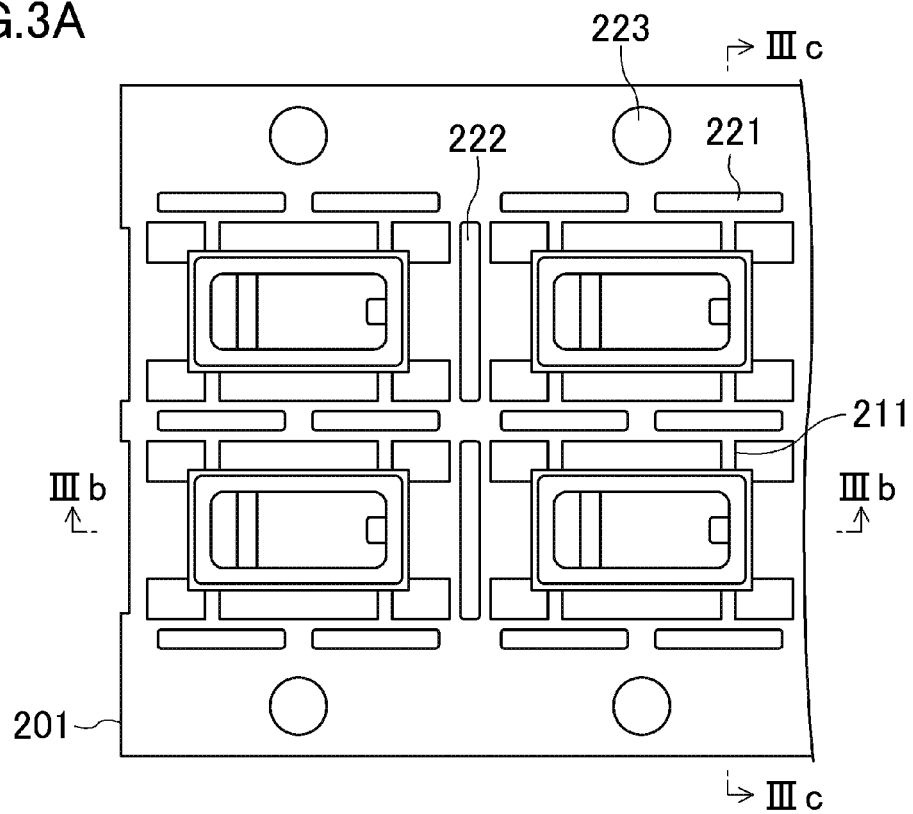
FIG. 3A is a plan view for describing the method for fabricating the semiconductor device of the embodiment.
Figure 3B:
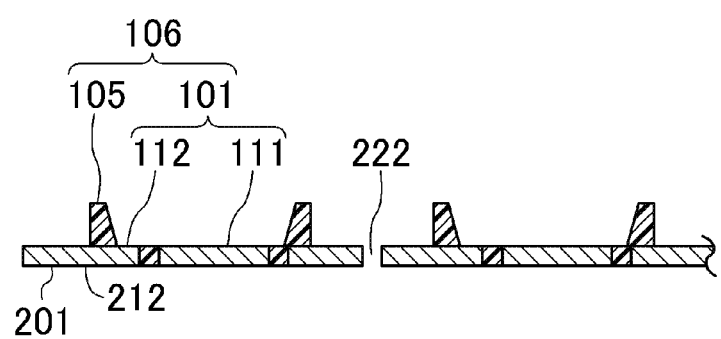
FIG. 3B is a cross-sectional view for describing the method for fabricating the semiconductor device of the embodiment, taken along line of FIG. 3A.
Figure 3C:
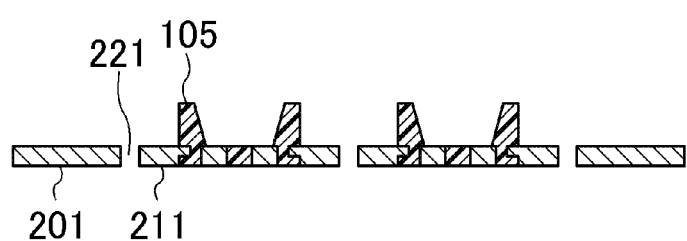
FIG. 3C is a cross-sectional view for describing the method for fabricating the semiconductor device of the embodiment, taken along line IIIc-IIIc of FIG. 3A.

Next, as shown in FIGS. 3A-3C, the frame-like member 105 surrounding the lead frame 101 is formed to provide a pre-molding lead frame 106 in which the lead frame 101 and the frame-like member 105 are integrated with each other. The frame-like member 105 may be formed by, but not limited to, commonly used insert molding, etc. The frame-like member 105 may be made of, for example, a thermoplastic resin containing a polyamide etc. as a major component or a thermosetting resin containing silicone etc. as a major component. Alternatively, the frame-like member 105 may be made of other resin materials. The frame-like member 105 is formed to cover the side surfaces of the lead frame 101 and expose the bottom surface of the lead frame 101. In addition, a tip portion of the holding lead 211 is buried in a side surface of the frame-like member 105. In the molding process, the frame-like member can be easily formed using the through hole 111a of the die pad portion 111 as a gate for injection of the resin. Also, if a lower end portion of an inner wall surface of the through hole 111a is exposed, a solder fillet can be trapped when soldering is performed on the semiconductor device, so that the semiconductor device can be more firmly fixed by the anchoring effect.

Figure 4A:
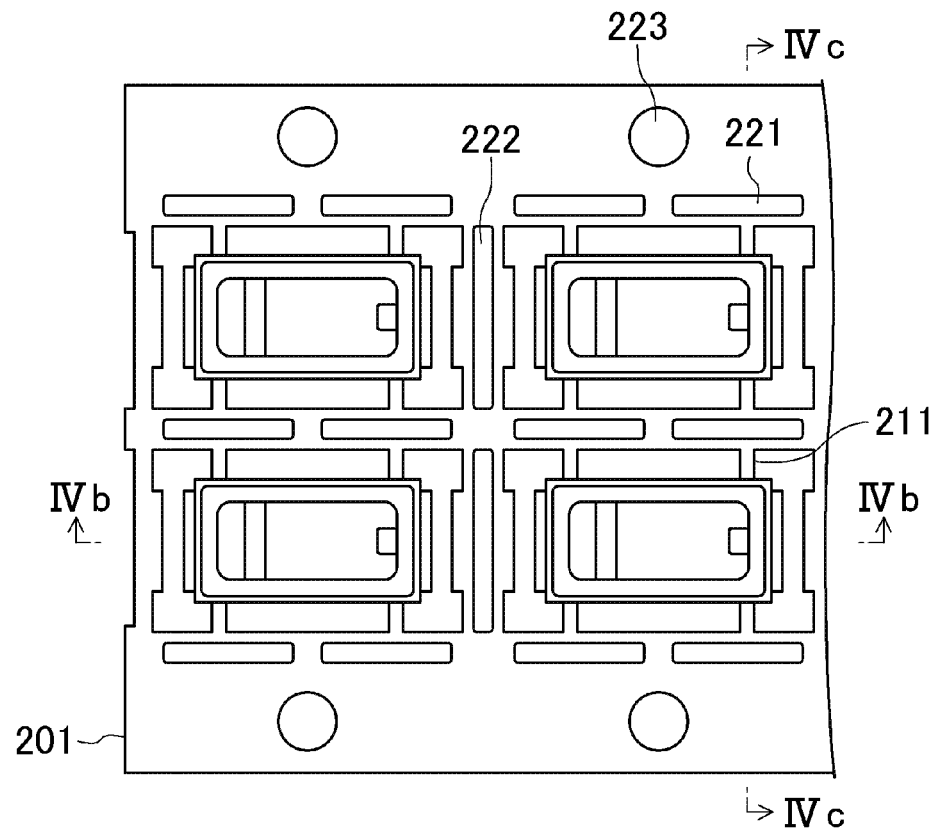
FIG. 4A is a plan view for describing the method for fabricating the semiconductor device of the embodiment.
Figure 4B:
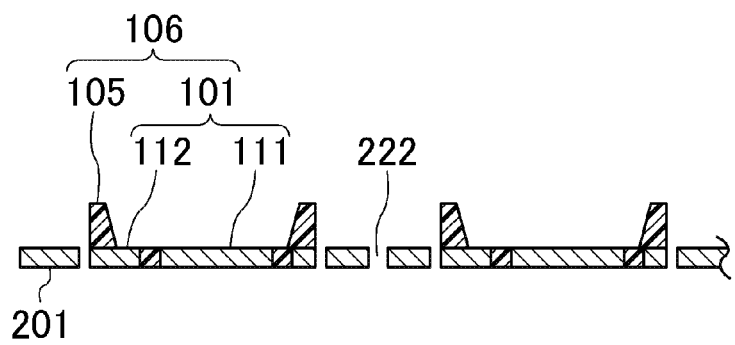
FIG. 4B is a cross-sectional view for describing the method for fabricating the semiconductor device of the embodiment, taken along line IVb-IVb of FIG. 4A.
Figure 4C:
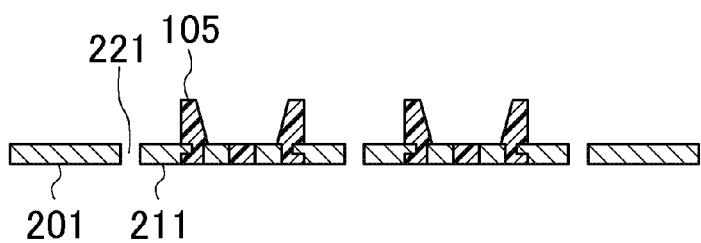
FIG. 4C is a cross-sectional view for describing the method for fabricating the semiconductor device of the embodiment, taken along line IVc-IVc of FIG. 4A.

Next, as shown in FIGS. 4A-4C, the tie bars 212 are cut, so that the die pad portion 111 and the lead portion 112 are cut off the rail 201. The die pad portion 111 and the lead portion 112 are cut off the rail 201 by a groove surrounding the lead frame 101. In this case, because the tip portions of the holding leads 211 are buried in the side surfaces of the frame-like member 105, the pre-molding lead frame 106 is still held by the rail 201. Therefore, a lead frame assembly is obtained in which the pre-molding lead frames 106 are held by the rail 201 while the lead frames 101 are insulated from the rail 201.

Figure 5A:
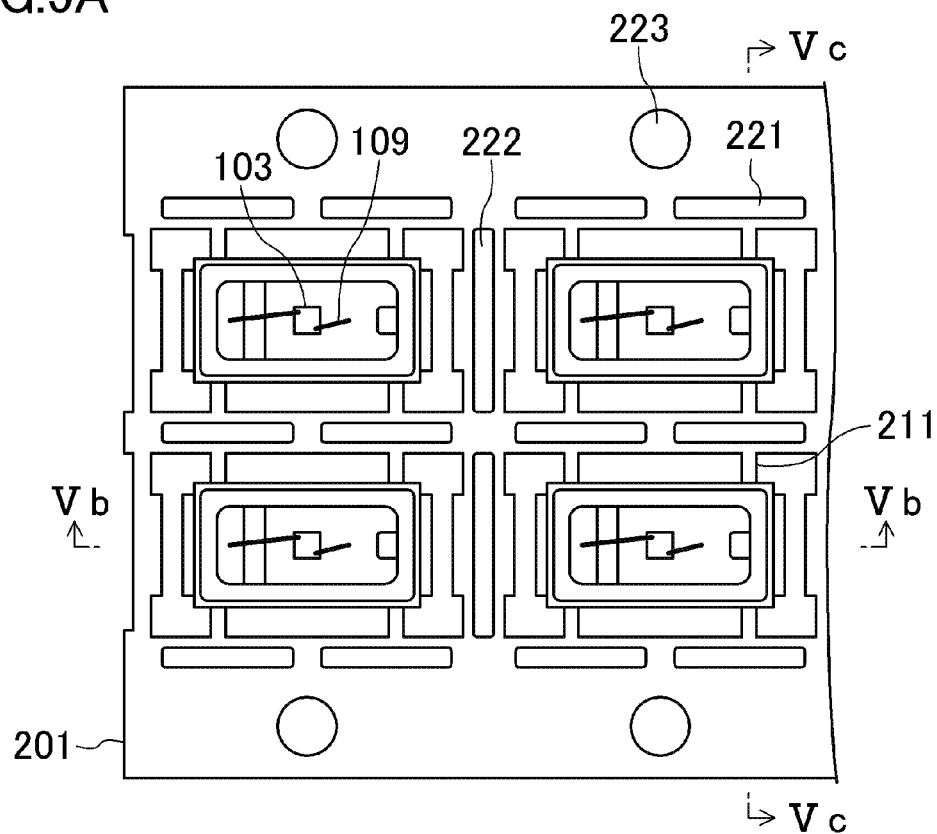
FIG. 5A is a plan view for describing the method for fabricating the semiconductor device of the embodiment.
Figure 5B:
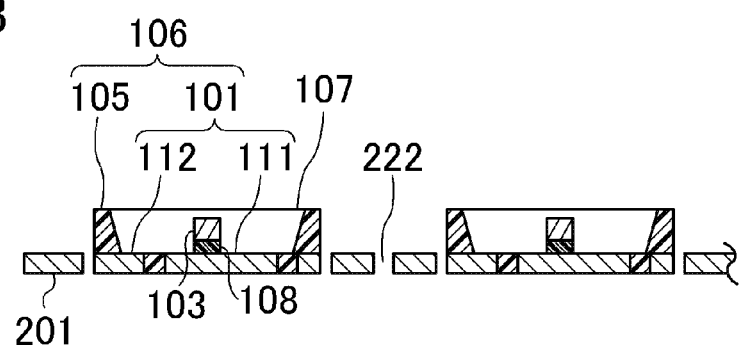
FIG. 5B is a cross-sectional view for describing the method for fabricating the semiconductor device of the embodiment, taken along line Vb-Vb of FIG. 5A.
Figure 5C:
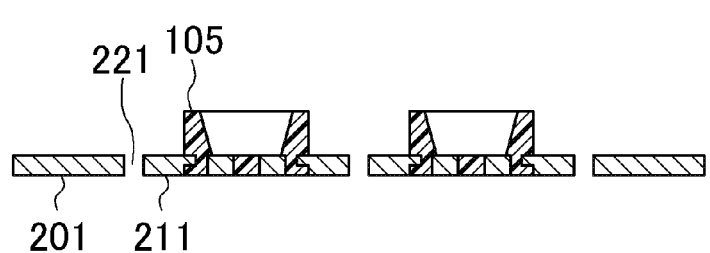
FIG. 5C is a cross-sectional view for describing the method for fabricating the semiconductor device of the embodiment, taken along line Vc-Vc of FIG. 5A.

Next, as shown in FIGS. 5A-5C, the semiconductor element 103 is bonded to the die pad portion 111, the wires 109 are bonded, and the protective resin 107 is poured. For example, the adhesive 108 may be applied to the element mounting portion 114 using a dispenser etc., the semiconductor element 103 may be placed in a region where the adhesive 108 has been applied, using a collet etc., and the adhesive 108 may be cured. The adhesive 108 may be, for example, a resin-based adhesive containing silicone as a major component. In this case, if the temperature is gradually increased to 50-150° C., and curing is performed for about 2-4 hours, voids are less likely to occur in the adhesive 108. The semiconductor element 103 may be fixed using solder etc. instead of the adhesive.

The wires 109 may be bonded while, for example, the lead frame assembly is fixed, by a suction force, to the heating stage of a wire bonding apparatus, and the outer edge portion of the frame-like member 105 is immobilized using a clamp. Before the wire bonding process, the upper surface of the lead frame 101 may be irradiated with argon plasma etc. to remove organic materials from the upper surface of the lead frame 101. The removal of organic materials can improve reliability. A bump bond may be formed on a second bond portion before wire bonding may be performed on the bump bond. A first bond of a second wire may be bonded to a second bond portion of a first wire to provide a security bond. The wire 109 may be, for example, a gold wire having a diameter of 25 µm.

The protective resin 107 may be, for example, a resin containing silicone as a major component, and may be poured using a dispenser etc. The temperature may be gradually increased to 50-150° C., and curing may be performed for about 2-4 hours. The protective resin 107 may contain a fluorescent material which absorbs light emitted by the semiconductor element 103 to emit light having a different wavelength.

Moreover, an electrical characteristic etc. is optionally tested while the pre-molding lead frame 106 is held by the rail 201. In the lead frame assembly of this embodiment, the die pad portion 111 and the lead portion 112 are insulated from the rail 201. Therefore, the characteristic test can be performed before the assembly is divided into individual semiconductor devices, whereby the efficiency of the characteristic test can be significantly increased.

Figure 6A:
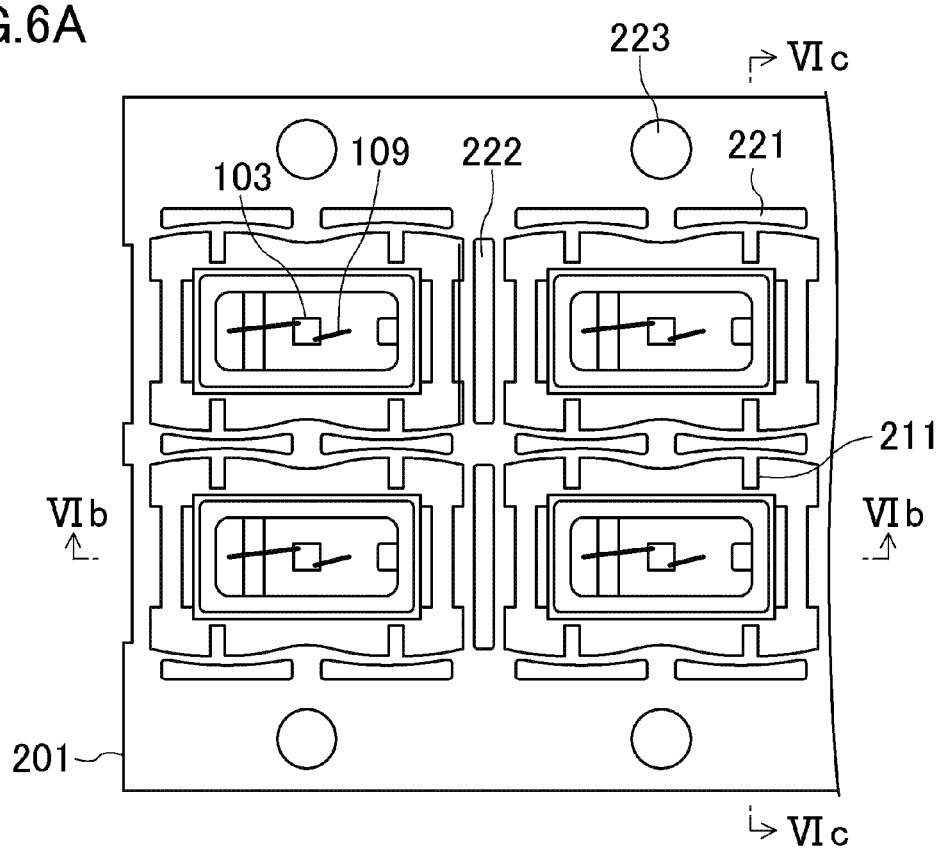
FIG. 6A is a plan view for describing the method for fabricating the semiconductor device of the embodiment.
Figure 6B:
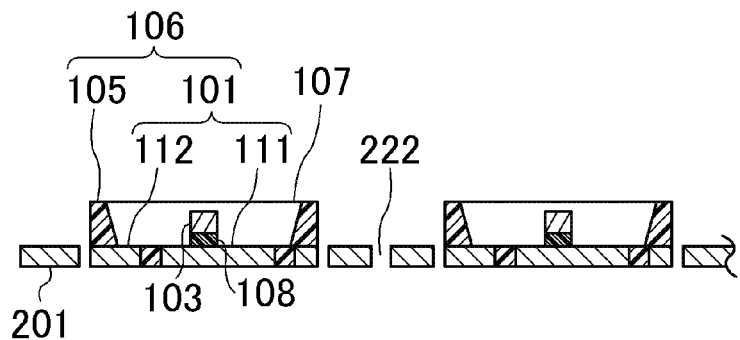
FIG. 6B is a cross-sectional view for describing the method for fabricating the semiconductor device of the embodiment, taken along line VIb-VIb of FIG. 6A.
Figure 6C:
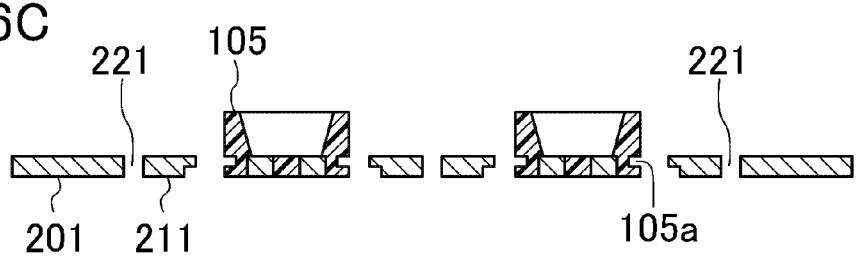
FIG. 6C is a cross-sectional view for describing the method for fabricating the semiconductor device of the embodiment, taken along line VIc-VIc of FIG. 6A.

Next, as shown in FIGS. 6A-6C, portions of the rail 201 where the holding leads 211 are formed are deformed in the horizontal direction to pull the tip portions of the holding leads 211 out of the frame-like member 105, so that the semiconductor device is removed from the rail 201. The rail 201 may be deformed using, for example, punches. Specifically, initially, the lead frame assembly is placed on a table. The lead frame assembly can be easily positioned using the guide holes 223 formed in the rail 201. Next, the punches may be inserted into the groove formed between the pre-molding lead frame 106 and the rail 201, and may be pushed further away from each other, so that the portions of the rail 201 where the holding leads 211 are formed may be deformed in the horizontal direction. In this embodiment, the rail 201 has the first slits 221 formed on a side of the holding leads 211 opposite to the lead frame 101. Therefore, the portions of the rail 201 where the holding leads 211 are formed can be easily expanded in the horizontal direction.

A notch is formed in a lower portion of the tip portion of the holding lead 211, and therefore, the tip portion of the holding lead 211 is thinner than the other portion of the holding lead 211 and the lead frame 101. Therefore, at the tip portion of the holding lead 211, the lower surface as well as the upper and side surfaces of the holding lead 211 contact the frame-like member 105. Therefore, the holding lead 211 works on an upward force as well, resulting in sufficient holding strength. On the other hand, when the rail 201 is deformed in the horizontal direction to increase the distance between each holding lead 211, the tip portions of the holding leads 211 can be easily pulled out of the side surface of the frame-like member 105. As a result, the pre-molding lead frame 106 can be held with sufficient strength during assembly and the semiconductor device can be easily removed from the rail 201 after assembly.

Figure 7A:
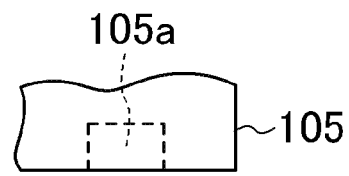
FIG. 7A is a plan view showing a concave portion of the semiconductor device of the embodiment.
Figure 7B:
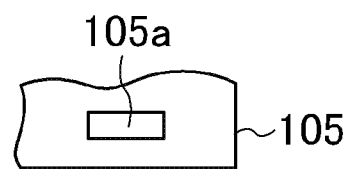
FIG. 7B is a bottom view showing the concave portion of the semiconductor device of the embodiment.
Figure 7C:
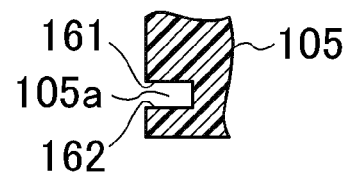
FIG. 7C is a cross-sectional view showing the concave portion of the semiconductor device of the embodiment.
Figure 8A:
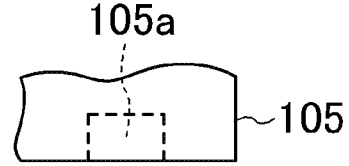
FIG. 8A is a plan view showing a variation of the concave portion of the semiconductor device of the embodiment.
Figure 8B:
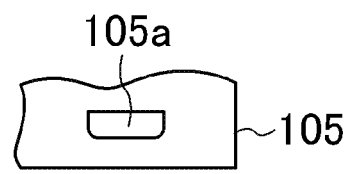
FIG. 8B is a bottom view showing the variation of the concave portion of the semiconductor device of the embodiment.
Figure 8C:
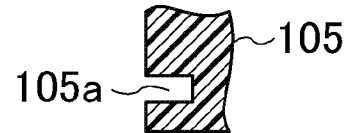
FIG. 8C is a cross-sectional view showing the variation of the concave portion of the semiconductor device of the embodiment.
Figure 9A:
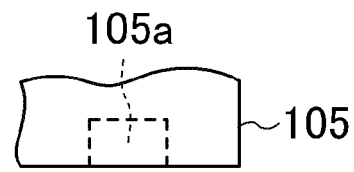
FIG. 9A is a plan view showing a variation of the concave portion of the semiconductor device of the embodiment.
Figure 9B:
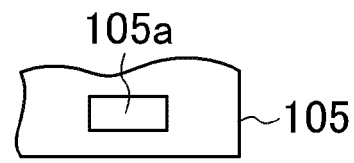
FIG. 9B is a bottom view showing the variation of the concave portion of the semiconductor device of the embodiment.
Figure 9C:
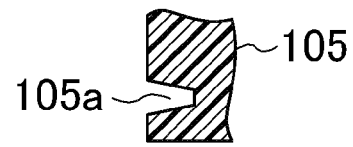
FIG. 9C is a cross-sectional view showing the variation of the concave portion of the semiconductor device of the embodiment.
Figure 10A:
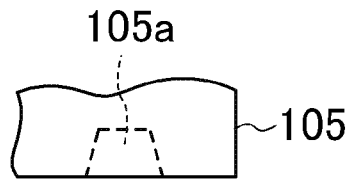
FIG. 10A is a plan view showing a variation of the concave portion of the semiconductor device of the embodiment.
Figure 10B:
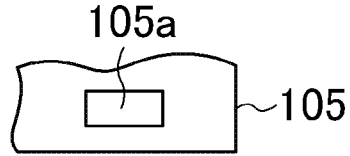
FIG. 10B is a bottom view showing the variation of the concave portion of the semiconductor device of the embodiment.
Figure 10C:
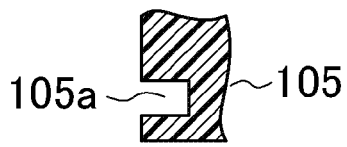
FIG. 10C is a cross-sectional view showing the variation of the concave portion of the semiconductor device of the embodiment.

When a notch is formed in a lower portion of the tip portion of the holding lead 211 to reduce the thickness of the tip portion of the holding lead 211, as shown in FIGS. 7A-7C a ceiling portion 161 of the concave portion 105a which is formed in a side surface of the frame-like member 105 after the holding lead 211 is pulled out is located at substantially the same height as that of the upper surface of the lead frame 101, and a bottom portion 162 of the concave portion 105a is located higher than the lower surface of the lead frame 101. The cross-sectional shape of the tip portion of the holding lead 211 does not need to have a rectangular shape. For example, as shown in FIGS. 8A-8C, lower corner portions of the holding lead 211 may have a curved shape. Alternatively, the holding lead 211 may has a curved lower surface. In these cases, the holding lead 211 can be more easily pulled out. A lower end of the tip portion of the holding lead 211 only needs to be located higher than the lower surface of the lead frame 101. Therefore, a notch may be formed at both upper and lower portions of the tip portion of the holding lead 211. In this case, the ceiling portion of the concave portion 105a is located lower than the upper surface of the lead frame 101, and the bottom portion of the concave portion 105a is located higher than the lower surface of the lead frame 101. As shown in FIGS. 9A-9C, if the tip portion of the holding lead 211 may be tapered in thickness, the holding lead 211 is more easily pulled out. As shown in FIGS. 10A-10C, the tip portion of the holding lead 211 may be tapered in width. The tip portion of the holding lead 211 may be tapered in both thickness and width. Instead of tapering, i.e., gradually or continuously reducing the thickness or width, the thickness or width may be reduced in a stepwise manner or discontinuously.

Figure 11A:
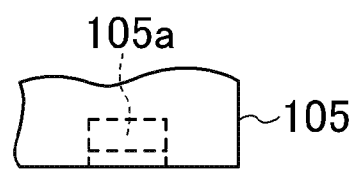
FIG. 11A is a plan view showing a variation of the concave portion of the semiconductor device of the embodiment.
Figure 11B:
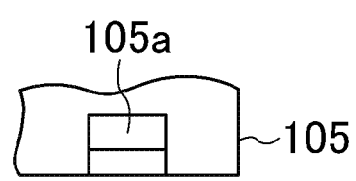
FIG. 11B is a bottom view showing the variation of the concave portion of the semiconductor device of the embodiment.
Figure 11C:
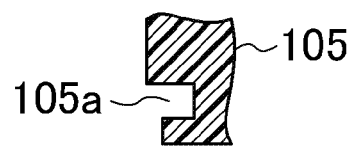
FIG. 11C is a cross-sectional view showing the variation of the concave portion of the semiconductor device of the embodiment.

Not only the thickness-reduced portion of the tip portion of the holding lead 211, but also a portion of the holding lead 211 having the same thickness as that of the lead frame 101, may be buried in the side surface of the frame-like member 105. In this case, as shown in FIGS. 11A-11C, a size in the thickness direction of an opening in the side surface of the frame-like member 105 is larger than a size of a deepest wall surface of the concave portion 105a, and a lower end of the opening in the side surface of the frame-like member 105 reaches a lower end of the frame-like member 105. When the frame-like member 105 is formed, the mold may be misaligned. If the holding lead 211 is designed so that only the thickness-reduced portion thereof will be buried in the side surface of the frame-like member 105, then if the mold is misaligned, so that a thick portion of the holding lead 211 may also be buried in the frame-like member 105, a resin protrusion may occur. If a large margin is desired so that only the thickness-reduced portion of the holding lead 211 will be buried, the thickness of a larger portion including the tip portion of the holding lead 211 needs to be reduced. If the thickness-reduced portion of the holding lead 211 is elongated, the strength of the holding lead 211 decreases. It is also difficult to produce such an elongated thickness-reduced portion. When a portion of the holding lead 211 having the same thickness as that of the lead frame 101 is also buried in the side surface of the frame-like member 105, there is a portion whose upper and side surfaces contact the frame-like member 105 and whose lower surface does not contact the frame-like member 105. However, not only the upper and side surfaces but also the lower surface of the tip portion of the holding lead 211 having a reduced thickness contact the frame-like member 105. Therefore, sufficient holding strength can be ensured.

Figure 12A:
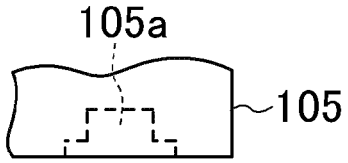
FIG. 12A is a plan view showing a variation of the concave portion of the semiconductor device of the embodiment.
Figure 12B:
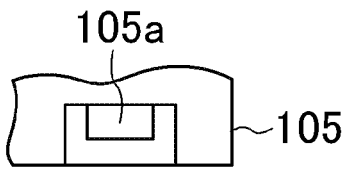
FIG. 12B is a bottom view showing the variation of the concave portion of the semiconductor device of the embodiment.
Figure 12C:
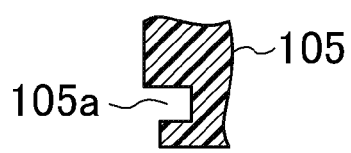
FIG. 12C is a cross-sectional view showing the variation of the concave portion of the semiconductor device of the embodiment.

Also in this case, the tip portion of the holding lead 211 may be tapered in either or both of thickness and width, or a lower portion of the tip portion of the holding lead 211 may be curved. The tip portion of the holding lead 211 may be narrowed in the width direction as well as in the thickness direction. In this case, as shown in FIGS. 12A-12C, the size in the width direction as well as the size in the thickness direction of the opening in the side surface of the frame-like member 105 are larger than those of the deepest wall surface of the concave portion 105a.

As the thickness of the tip portion of the holding lead 211 is reduced, the semiconductor device is more easily removed. However, when the thickness of the tip portion of the holding lead 211 is excessively reduced, the strength of the tip portion of the holding lead 211 decreases. It is also more difficult to form such a holding lead 211. Therefore, the tip portion of the holding lead 211 may be cut so that the thickness of the tip portion of the holding lead 211 is reduced by one tenth to one third of the thickness of the lead frame 101, i.e., the thickness of the tip portion of the holding lead 211 becomes nine tenths to two thirds of the thickness of the lead frame 101. For example, when the thickness of the lead frame is 0.3 mm, the thickness of the tip portion of the holding lead 211 may be reduced by about 0.03-0.1 mm to become about 0.27-0.2 mm. In this embodiment, the thickness of the tip portion of the holding lead 211 is reduced by about 0.06 mm to become about 0.24 mm.

As the width and depth of the portion of the holding lead 211 which is buried in the side surface of the frame-like member 105 are increased, the holding strength of the holding lead 211 increases. On the other hand, when the semiconductor device is removed from the rail 201, the rail 201 needs to be deformed to a large degree, or greater stress occur when the holding lead 211 is pulled out. For example, when the outer circumference of the frame-like member 105 has a rectangular shape as viewed from above, and two pairs of holding leads 211 facing each other are provided, the width and depth of the thickness-reduced portion of the holding lead 211 may be about 0.15-0.4 mm and about 0.05-0.15 mm, respectively. Although only the thickness-reduced portion of the holding lead 211 may be buried in the side surface of the frame-like member 105, a portion of the holding lead 211 having the same thickness as that of the lead frame 101 may also be buried in the side surface of the frame-like member 105. In this case, the depth of the portion of the holding lead 211 which has the same thickness as that of the lead frame 101 and is buried in the side surface of the frame-like member 105, may be about 0.005-0.05 mm. In this embodiment, the width and depth of the thickness-reduced portion of the holding lead 211 are 0.3 mm and 0.1 mm, respectively, and the depth of the portion of the holding lead 211 which has the same thickness as that of the lead frame 101 and is buried in the side surface of the frame-like member 105, is 0.02 mm.

In this embodiment, two pairs of holding leads 211 facing each other across the lead frame 101 are provided. Alternatively, only one pair of holding leads 211 or only one holding lead 211 may be provided when high holding strength is not required. Alternatively, three or more pairs of holding leads 211 may be provided. Moreover, each pair of holding leads 211 may not face each other or may be offset from each other. It is not necessary to provide the same number of holding leads 211 on the opposite sides of the lead frame 101. For example, two holding leads 211 may be provided on one side of the lead frame 101, while only one holding lead 211 may be provided on the other side. Although an example in which the holding leads 211 are provided along the longer sides the frame-like member 105 has been described above, the holding leads 211 may be provided along the shorter sides of the frame-like member 105. The holding leads 211 may be formed along both of the longer and shorter sides of the frame-like member 105. Although an example in which the holding leads 211 are provided along the sides of the frame-like member 105 where the external terminal 115 is not formed has been described above, the holding leads 211 may be provided along the sides of the frame-like member 105 where the external terminal 115 is formed.

Although an example in which only one semiconductor element is mounted on a lead frame has been described above, a plurality of semiconductor elements may be mounted. A resistor, a capacitor, etc. may also be mounted together with the semiconductor element. Although an example in which two external terminals are formed has been described above, a plurality of lead portions and three or more external terminals may be formed. The semiconductor element is not limited to light emitting elements (e.g., light emitting diodes, superluminescence diodes, laser diodes, etc.), photodetector elements, etc., and may be other types of transistors, diodes, sensors, etc. The protective resin may optionally be made of a light shield material. Although an example in which a semiconductor device has a frame-like member which is in the shape of a rectangle as viewed from above has been described above, a frame-like member which is in the shape of a square as viewed from above may be employed. Alternatively, the frame-like member may be in the shape of a polygon, a circle, an ellipse, an oval, etc. as viewed from above.

The semiconductor device of the present invention can be reliably held during assembly and can be easily removed after assembly even when only one surface of a lead frame is encapsulated. The present disclosure is particularly useful for resin encapsulated semiconductor devices including surface mount lead frames.

What is claimed is:

1. A semiconductor device comprising:
   a lead frame;
   a semiconductor element mounted on the lead frame; and
   a frame-like member formed on the lead frame, surrounding the semiconductor element, and covering a side surface of the lead frame and exposing a lower surface of the lead frame,
   wherein the frame-like member has at least one concave portion in a side surface thereof, which does not contact the lead frame, and
   the concave portion has a ceiling portion located at the same height as or lower than an upper surface of the lead frame, and a bottom portion located higher than the lower surface of the lead frame.

2. The semiconductor device of claim 1, wherein the concave portion has an opening in the side surface of the frame-like member, and a size of the opening is larger than a size of a deepest wall surface of the concave portion.

3. The semiconductor device of claim 2, wherein the concave portion reaches a lower end of the frame-like member in the side surface of the frame-like member.

4. The semiconductor device of claim 1, wherein there are a plurality of the concave portions formed in a first and a second side surface of the frame-like member, said plurality of the concave portions includes said at least one concave portion 5. The semiconductor device of claim 4, wherein the concave portions are disposed at positions aligned with each other in the first and second side surfaces.

6. The semiconductor device of claim 5, wherein the lead frame is narrower at a position corresponding to the concave portion than at the other portion of the lead frame.

7. The semiconductor device of claim 1, wherein
the lead frame has a die pad portion to which the semiconductor element is bonded and a lead portion separated from the die pad portion, and
the semiconductor element is disposed at a center portion of the frame-like member.

8. The semiconductor device of claim 7, wherein
the die pad portion has a through hole,
the frame-like member has a wall portion rising from the upper surface of the lead frame and a buried portion which is buried in the through hole and is integrated with the wall portion, and
at least a portion of a lower surface of the buried portion is located higher than a lower surface of the die pad portion.

9. A method for fabricating a semiconductor device, comprising the steps of:
(a) forming an opening in a substrate at a predetermined position to form a rail, a lead frame, a tie bar attaching the lead frame to the rail, and a holding lead protruding from the rail toward the lead frame and separated from the lead frame, said holding lead having a tip portion;
(b) after step (a), forming a frame-like member which is provided on an outer edge portion of the lead frame and in which the tip portion of the holding lead is buried, to form a pre-molding lead frame including the lead frame and the frame-like member;
(c) after step (b), cutting the tie bar; and
(d) after step (c), pulling the tip portion of the holding lead out of the frame-like member to remove the pre-molding lead frame from the rail,
wherein in step (a), the tip portion of the holding lead is caused to be thinner than the lead frame, and
in step (b), the frame-like member is formed to expose a bottom surface of the lead frame and cover an upper, a side, and a lower surface of the tip portion of the holding lead, and has at least one concave portion in a side surface which does not contact the lead frame.

10. The method of claim 9, further comprising the steps of:
(e) after step (c) and before step (d), mounting a semiconductor element on the lead frame; and
(f) after step (e) and before step (d), filling a space surrounded by the frame-like member with a protective resin.

11. The method of claim 10, further comprising the step of:
(g) after step (e) and before step (d), testing an electrical characteristic of the semiconductor element.

12. The method of claim 9, wherein in step (a), a slit is formed in the rail on a side of the holding lead opposite to the lead frame.

13. The semiconductor device of claim 1, further comprising a protective resin disposed in a space surrounded by the frame-like member.

* * * * *